United States Patent
Shih et al.

(10) Patent No.: US 8,362,535 B2
(45) Date of Patent: Jan. 29, 2013

(54) LAYOUT STRUCTURE OF NON-VOLATILE MEMORY DEVICE

(75) Inventors: Hung-Lin Shih, Hsinchu (TW); Jr-Bin Chen, Taipei (TW); Pei-Ching Yin, Hsinchu (TW); Hui-Fang Tsai, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 328 days.

(21) Appl. No.: 12/568,953

(22) Filed: Sep. 29, 2009

(65) Prior Publication Data
US 2011/0073924 A1 Mar. 31, 2011

(51) Int. Cl.
*H01L 27/108* (2006.01)
*H01L 29/66* (2006.01)

(52) U.S. Cl. ........ 257/296; 257/300; 257/314; 257/390; 257/E27.075; 257/E27.076; 365/185.05; 365/185.08

(58) Field of Classification Search ............. 257/296, 257/300, 314, 390, E21.409, E21.437, E21.545, 257/E27.102, 326, E27.076, E27.084, 297, 257/298, 260, 261, 315, 316, 317, 318, 391, 257/E27.075, E27.077, E27.103, E27.104; 438/4, 238, 201; 365/185, 185.05, 185.08
See application file for complete search history.

(56) References Cited

U.S. PATENT DOCUMENTS

| | | | | |
|---|---|---|---|---|
| 5,929,478 A * | 7/1999 | Parris et al. | | 257/314 |
| 6,326,663 B1 * | 12/2001 | Li et al. | | 257/318 |
| 7,095,076 B1 * | 8/2006 | Han et al. | | 257/319 |
| 7,095,651 B2 * | 8/2006 | Shirota et al. | | 365/185.05 |
| 7,099,192 B2 * | 8/2006 | Wang et al. | | 365/185.1 |
| 7,423,903 B2 | 9/2008 | Lin et al. | | |
| 7,477,546 B2 * | 1/2009 | Fang et al. | | 365/185.05 |
| 7,688,627 B2 * | 3/2010 | Haggag et al. | | 365/185.08 |
| 7,919,368 B2 * | 4/2011 | Wu et al. | | 438/238 |
| 2005/0270850 A1 * | 12/2005 | Wang et al. | | 365/185.28 |
| 2006/0067124 A1 * | 3/2006 | Lee et al. | | 365/185.11 |
| 2007/0120176 A1 * | 5/2007 | Tanaka | | 257/316 |
| 2007/0257331 A1 | 11/2007 | Kurjanowicz et al. | | |
| 2009/0267127 A1 * | 10/2009 | Chen et al. | | 257/314 |

OTHER PUBLICATIONS

YMC MTP CELL Introduction.

* cited by examiner

*Primary Examiner* — Colleen Matthews
*Assistant Examiner* — Galina Yushina
(74) *Attorney, Agent, or Firm* — Ding Yu Tan

(57) ABSTRACT

A non-volatile memory cell includes a semiconductor substrate with isolation structures formed therein and thereby transistor region and capacitor region are defined therein. A conductor is disposed over the isolation structures, the transistor region and a first-type doped well disposed in the capacitor region. The conductor includes a capacitor portion disposed over the first-type doped well, a transistor portion disposed over the transistor region, a first edge disposed over the isolation structure at a side of the transistor region, and an opposite second edge disposed over the first-type doped well. Two first ion doped wells are disposed in the transistor region and respectively at two sides of the transistor portion, and constitutes a transistor with the transistor portion. A second ion doped region is disposed in the capacitor region excluding the conductor and constitutes a capacitor with the capacitor portion.

14 Claims, 3 Drawing Sheets

LAYOUT STRUCTURE OF NON-VOLATILE MEMORY DEVICE

BACKGROUND

1. Technical Field

The present invention generally relates to a semiconductor device and a layout structure thereof and, more particularly to a non-volatile memory cell and a layout structure of non-volatile memory device.

2. Description of the Related Art

Non-volatile memory (NVM) devices have the advantage of stored data would not disappear even when power supplied thereto is interrupted, and therefore have become one of widespread memory devices for data storage.

According to read-write cycle limits of memory devices, the non-volatile memory devices are classified into one type of multi-time programmable (MTP) memory device having repeatable read/write functionality and another type of one-time programmable (OTP) memory device only can be written a single time with data. In another aspect, from the viewpoint of device structure, the non-volatile memory devices primarily can be classified into double-poly non-volatile memory devices and single-poly non-volatile memory devices.

Since the non-volatile memory devices are compatible with the common complementary metal oxide semiconductor (CMOS) process, and thus are usually used in embedded memory fields. However, in an advanced logic process, the manufacturing process of the embedded memory devices by using the double-poly non-volatile memory devices is more complicated and has high cost, the device yield is also not good. Accordingly, in the advanced logic process, the single-poly non-volatile memory devices relatively have certain advantages and thus are regarded as more competitive memory devices in next generation.

FIG. 1 is a schematic, partial top view of a layout structure of single-poly multi-time programmable non-volatile memory device.

As illustrated in FIG. 1, a semiconductor substrate 100 has P-type well regions 112 and N-type Well regions 114 disposed therein. Moreover, a plurality of isolation structures 160 are disposed between the P-type well regions 112 and N-type Well regions 114. The conventional single-poly multi-time programmable non-volatile memory device includes a plurality of memory cells 110. Each of the memory cells 110 is consisted of a transistor 120 disposed in the P-type well region 112 and a capacitor 140 disposed in the N-type well region 114. The transistor 120 employs a poly-silicon layer g1 as a gate electrode, and uses two ion doped regions disposed in the P-type well region 112 and at two sides of the poly-silicon layer g1 respectively as a source electrode S and a drain electrode D. The capacitor 140 employs an ion doped region in the N-type well region 114 as a control gate CG of the memory cell 110, and uses a poly-silicon layer g2 over the N-type well region 114 as an electrode of the capacitor 140. The gate electrode of the transistor 120 and the electrode of the capacitor 140 are electrically connected with each other and constitute a floating gate FG. The floating gate FG is perpendicularly disposed over the P-type well region 112 and the N-type well region 114, and extends over a part of the isolation structures 160.

The memory cells 110 of the conventional non-volatile memory device are arranged in an array. The transistors 120 sequentially arranged along X-axis coordinate direction and the adjacent capacitors 140 sequentially arranged along X-axis coordinate direction are used as a repeating unit. Furthermore, a plurality of word lines WL extend along X axis coordinate direction and arranged in parallel in Y-axis coordinate direction, and the word lines WL are electrically coupled to the respective control gates CG of the capacitors 140 arranged along X-axis coordinate direction. A plurality of bit lines BL (not shown) extend along Y-axis coordinate direction and arranged in parallel in X-axis coordinate direction and perpendicularly crossing with the word lines WL, and the bit lines BL are electrically coupled to the respective drain electrodes of the transistors 120 arranged along Y-axis coordinate direction.

Still referring to FIG. 1, the conventional layout structure of non-volatile memory device takes one capacitor 140 and two transistors 120 as a minimum memory cell, and the layout design is that using one word line WL to control two bit lines BL.

However, the current development trend of memory device is toward higher memory density and the programming speed of memory device also is expected to be gradually improved. Therefore, how to achieve the above-mentioned aims will be one of important issues for the development of memory device.

BRIEF SUMMARY

Accordingly, the present invention is directed to a non-volatile memory cell can relatively lower leakage currents generated at corners of isolation structure, and a capacitor thereof can achieve higher coupling efficiency.

The present invention further is directed to a layout structure of non-volatile memory device can improve the programming speed of memory device and the device density, besides can lower leakage currents generated at corners of isolation structure and increase coupling efficiency of capacitor.

A non-volatile memory cell in accordance with an embodiment of the present invention is provided. The non-volatile memory cell includes a semiconductor substrate, a plurality of isolation structures, a first-type doped well, a conductor, two first ion doped regions and a second ion doped region. The isolation structures are disposed in the semiconductor substrate and thereby a transistor region and a capacitor region are defined in the semiconductor substrate. The capacitor region has the first-type doped well disposed therein. The conductor is disposed over the isolation structures, the transistor region and the first-type doped well. The conductor includes a capacitor portion and a transistor portion. The capacitor portion is disposed over the first-type doped well. The transistor portion is disposed over the transistor region. The conductor further includes a first edge and a second edge opposite to each other. The first edge is disposed over the isolation structure at a side of the transistor region. The second edge is disposed over the first-type doped well. Moreover, the two first ion doped regions are in the transistor region and respectively at two opposite sides of the transistor portion. The two first ion doped regions and the transistor portion of the conductor cooperatively constitute a transistor. The second ion doped region is disposed in the first-type doped well and at a side of the conductor. The second ion doped region and the capacitor portion of the conductor constitute a capacitor.

In one embodiment, the semiconductor substrate is a second-type doped semiconductor substrate, e.g., a P-type doped semiconductor substrate; the first-type doped well is an N-type doped well, the first ion doped regions and the second ion doped region are N-type ion doped regions.

In one embodiment, the non-volatile memory cell further includes a second-type doped well disposed in the transistor region, the first ion doped regions are disposed in the second-type doped well. The second-type doped well is for example a P-type doped well, the first-type doped well is an N-type doped well, the first ion doped regions and the second ion doped region are N-type ion doped regions.

In one embodiment, a width of the first-type doped well in a direction (i.e., lengthwise direction of the conductor) perpendicular to a lengthwise direction of the isolation structures is larger than twice of length of the capacitor portion in the direction perpendicular to the lengthwise direction of the isolation structures.

In one embodiment, lengths of the transistor portion and the capacitor portion of the conductor in a direction perpendicular to a lengthwise direction of the isolation structures are equal to each other.

In one embodiment, lengths of the transistor portion and the capacitor portion of the conductor in a direction perpendicular to a lengthwise direction of the isolation structures are different from each other.

A layout structure of non-volatile memory device in accordance with an embodiment of the present invention is provided. The layout structure of non-volatile memory device includes a semiconductor substrate, a plurality of first-type doped wells, a plurality of first conductors, a plurality of second conductors, a plurality of first ion doped regions, a plurality of second ion doped regions, a plurality of word lines and a plurality of bit lines. The semiconductor substrate has a plurality of isolation structures disposed therein and thereby a plurality of first transistor regions, a plurality of capacitor regions and a plurality of second transistor regions are defined in the semiconductor substrate. Each of the capacitor regions is disposed between corresponding first transistor region and second transistor region, and each two adjacent capacitor regions have corresponding first transistor region and second transistor region arranged therebetween. The first-type doped wells are disposed in the respective capacitor regions.

Moreover, the first conductors are arranged over the respective isolation structures, first transistor regions and first-type doped wells. Each of the first conductors includes a first capacitor portion and a first transistor portion, the first capacitor portion is disposed over a corresponding one of the first-type doped wells, and the first transistor portion is disposed over a corresponding one of the first transistor regions. Each of the first conductors further includes a first edge and a second edge opposite to each other, the first edge is disposed over the isolation structure at a side of the corresponding one of the first transistor regions, and the second edge is disposed over the corresponding one of the first-type doped wells. The second conductors are over the respective isolation structures, second transistor regions and first-type doped wells. Each of the second conductors includes a second capacitor portion and a second transistor portion, the second capacitor portion is disposed over a corresponding one of the first-type doped wells, and the second transistor portion is disposed over a corresponding one of the second transistor regions. Each of the second conductors further includes a third edge and a fourth edge, the third edge is disposed over the isolation structure at a side of the corresponding one of the second transistor regions, and the fourth edge is disposed over the corresponding one of the first-type doped wells and adjacent with one of the second edges of the first conductors.

In addition, the first ion doped regions are disposed in the respective first transistor regions at two sides of the first conductors, as well as disposed in the respective second transistor regions at two sides of the respective second conductors. The first ion doped regions constitute a plurality of first transistors cooperatively with the respective first transistor portions of the first conductors, as well as constitute a plurality of second transistors cooperatively with the respective second transistor portions of the second conductors. Each of the second ion doped regions is disposed in the first-type doped well between adjacent first conductor and second conductor. The second ion doped regions constitute a plurality of capacitors cooperatively with the respective first capacitor portions of the first conductors and the respective second capacitor portions of the second conductors. The word lines are arranged on the semiconductor substrate. The word lines are electrically coupled to the respective second ion doped regions. The bit lines are arranged on the semiconductor substrate and perpendicular to the word lines. The bit lines are electrically coupled to a part of the first ion doped regions respectively.

In one embodiment, the semiconductor substrate is a second-type doped semiconductor substrate, e.g., a P-type doped semiconductor substrate, and the first-type doped wells are N-type doped wells. The first ion doped regions and the second ion doped regions are N-type ion doped regions.

In one embodiment, the layout structure of non-volatile memory device further includes a plurality of second-type doped wells; the second-type doped wells are sequentially arranged and discontinuously disposed in the respective first transistor regions and second transistor regions, and the first ion doped regions are disposed in the respective second-type doped wells. The second-type doped wells are for example P-type doped wells, the first-type doped wells are N-type doped wells, the first ion doped regions and the second ion doped regions are N-type ion doped regions.

In one embodiment, lengths of the first capacitor portions and the second capacitor portions in a direction (i.e., lengthwise direction of the first and second conductors) perpendicular to a lengthwise direction of the isolation structures are equal to each other. Moreover, a width of each of the first-type doped wells in the direction perpendicular to the lengthwise direction of the isolation structures is larger than twice of the length of each of the first capacitor portions in the direction perpendicular to the lengthwise direction of the isolation structures.

In one embodiment, lengths of the first transistor portion and the first capacitor portion of each of the first conductors in a direction perpendicular to a lengthwise direction of the isolation structures are equal to each other.

In one embodiment, lengths of the first transistor portion and the first capacitor portion of each of the first conductors in a direction perpendicular to a lengthwise direction of the isolation structures are different from each other.

In one embodiment, lengths of the second transistor portion and the second capacitor portion of each of the second conductors in a direction perpendicular to a lengthwise direction of the isolation structures are equal to each other.

In one embodiment, lengths of the second transistor portion and the second capacitor portion of each of the second conductors in a direction perpendicular to a lengthwise direction of the isolation structures are different from each other.

In the above-mentioned embodiments of the present invention, since the conductors (i.e., floating gates) do not extend beyond the respective first-type doped wells, compared with the conventional device design, the components (i.e., transistor and capacitor) and the isolation structures have reduced corners of isolation structure located therebetween, and thus leakage currents produced at the corners of isolation structure are lowered. Furthermore, an edge length of an overlap portion between the capacitor portion and the corresponding first-type doped well is increased, so that the capacitor can achieve higher coupling efficiency, an operating voltage of the memory device is lowered and the device performance is improved. In addition, the layout structure associated with the present invention can use one word line WL to control four bit lines BL, the programming speed of memory device is increased and much more memory cells can be configured in per unit area so that device density is increased.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 2:
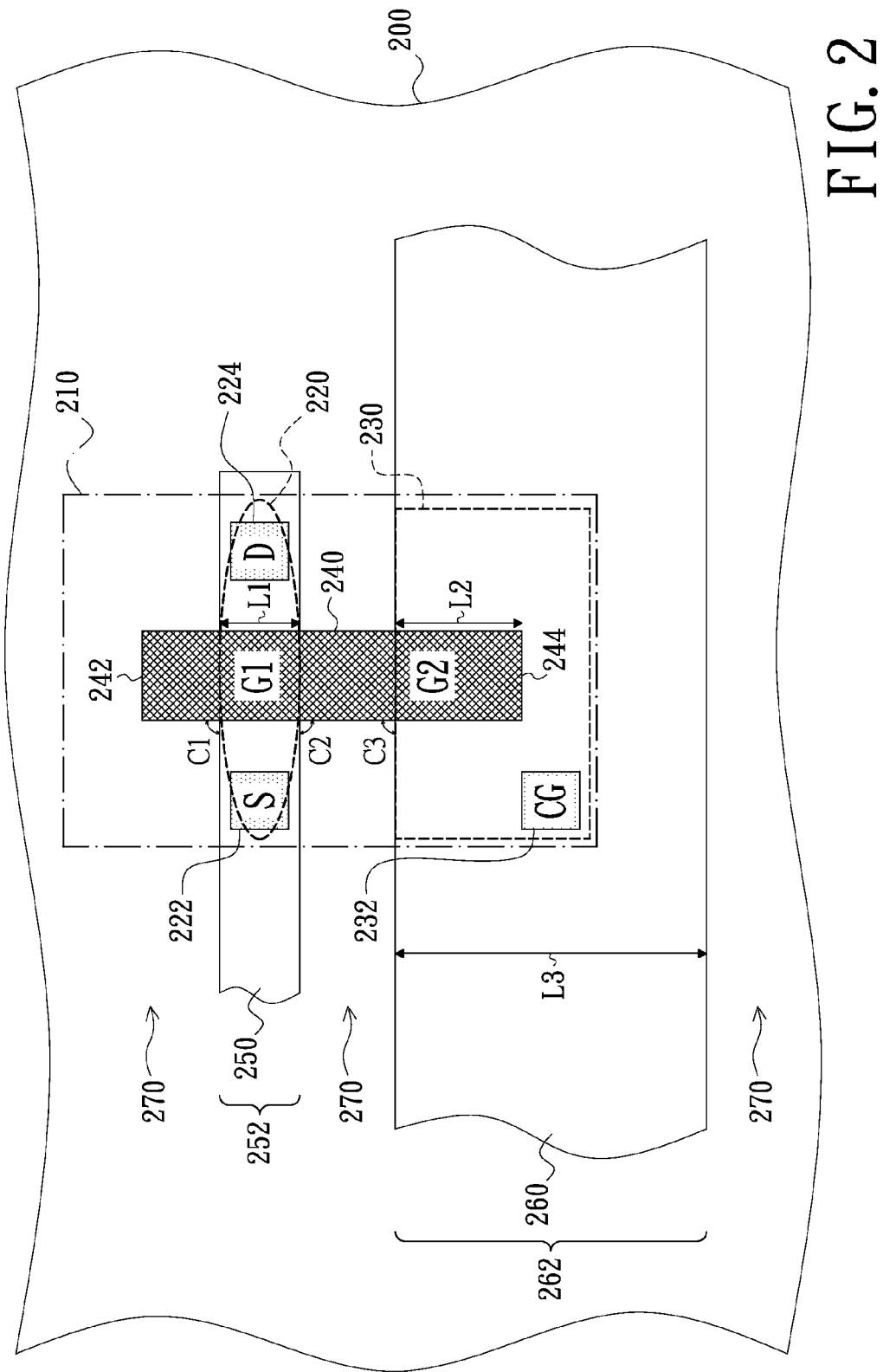
FIG. 2 is a schematic top view a non-volatile memory cell in accordance with an embodiment of the present invention.

FIG. 2 is a schematic top view of a non-volatile memory cell in accordance with an embodiment of the present invention.

As illustrated in FIG. 2, the non-volatile memory cell 210 is comprised of a semiconductor substrate 200, a conductor 240, a plurality of isolation structures 270, a first-type doped well 260, two first ion doped regions 222, 224 and a second ion doped region 232.

The semiconductor substrate 200 has the isolation structures 270 arranged in parallel with one another and disposed therein. The isolation structures 270 are for example shallow trench isolation (STI) structures. The isolation structures 270 define a transistor region 252 and a capacitor region 262 in parallel with the transistor region 252 in the semiconductor substrate 200. The first-type doped well 260 is disposed in the capacitor region 262 and is for example an N-type doped well.

In the illustrated embodiment, the semiconductor substrate 200 is for example a non-doped semiconductor substrate, and the non-volatile memory cell 210 further includes a second-type doped well 250. The second-type doped well 250 is for example a P-type doped well and disposed in the transistor region 252. It is understood that, in another embodiment, a second-type doped material can be directly doped in the semiconductor substrate 200 instead, so that the semiconductor substrate becomes a second-type doped semiconductor substrate, for example a P-type doped semiconductor substrate.

The conductor 240 is disposed over the isolation structures 270, the transistor region 252 and the first-type doped well 260. The conductor 240 includes a capacitor portion G2 and a transistor portion G1. The capacitor portion G2 is disposed over the first-type doped well 260, and the transistor portion G1 is disposed over the transistor region 252. The conductor 240 further includes a first edge 242 and a second edge 244 opposite to each other. The first edge 242 is disposed over the isolation structure 270 at a side of the transistor region 252, and the second edge 244 is disposed over the first-type doped well 260. More specifically, the conductor 240 starts from above the isolation structure 270, extends over the transistor region 252 and across the isolation structure 270 between the transistor region 252 and the capacitor region 262, and thereafter formed over a part of the first-type doped well 260. The conductor 240 is made of a conductive material for example, doped poly-silicon. The conductor 240 acts as a floating gate (FG) of the non-volatile memory cell 210.

The first ion doped regions 222, 224 of the non-volatile memory cell 210 are for example N-type ion doped regions. The first ion doped regions 222, 224 are disposed in the second-type doped well 250 of the transistor region 252 and respectively at two sides of the transistor portion G1 of the conductor 240. The first ion doped regions 222, 224 can constitute a transistor 220 cooperatively with the transistor portion G1 of the conductor 240 and respectively acts as a source electrode S and a drain electrode D of the transistor 220.

In addition, the second ion doped region 232 is for example an N-type ion doped region. The second ion doped region 232 is disposed in the first-type doped well 260 and at a side of the conductor 240. The second ion doped region 232 and the capacitor portion G2 of the conductor 240 cooperatively constitute a capacitor 230. The second ion doped region 232 acts as a control gate CG of the non-volatile memory cell 210.

Figure 1:
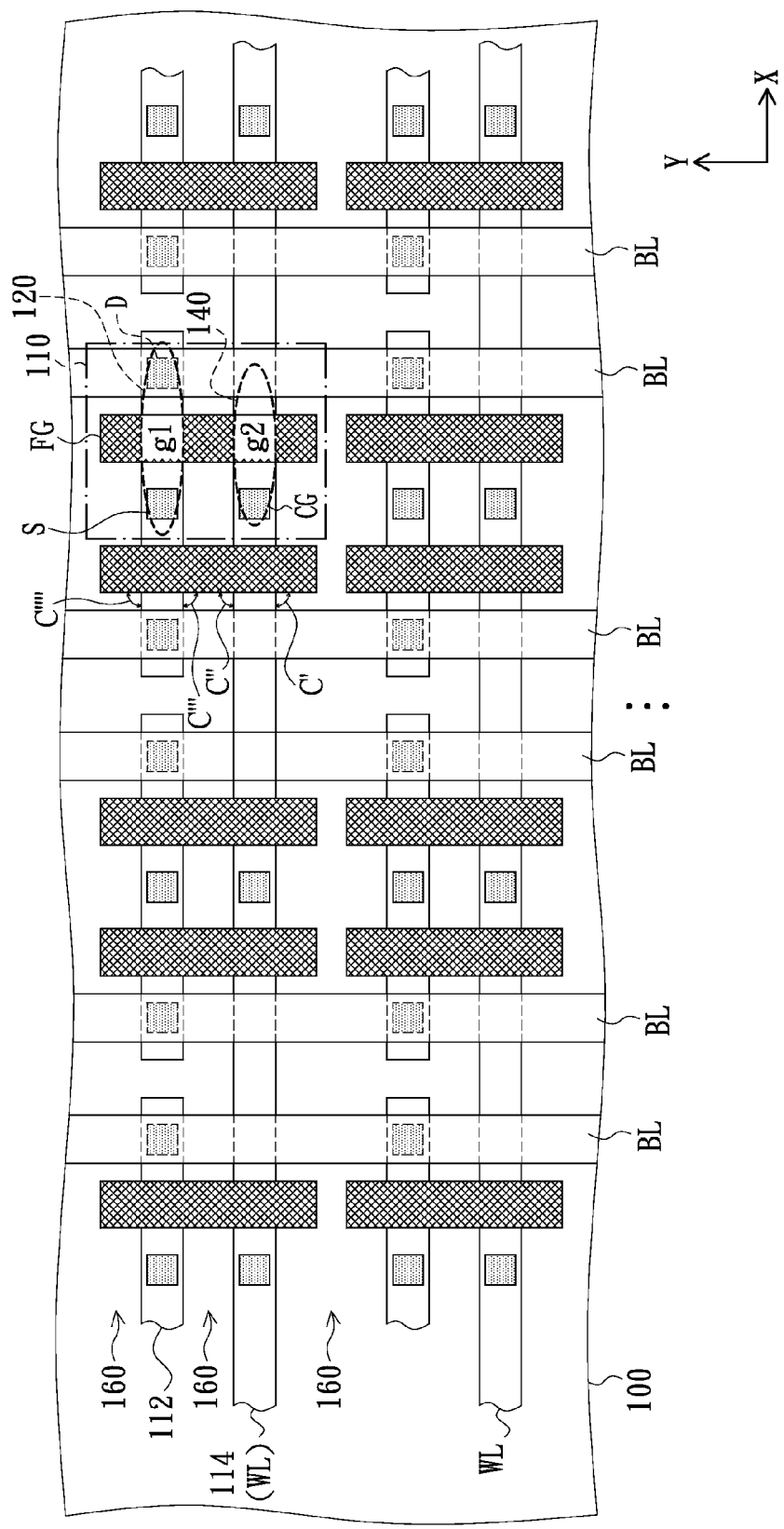
FIG. 1 is a schematic, partial top view of a layout structure of single-poly multi-time programmable non-volatile memory device associated with the prior art.

In particular, as illustrated in FIG. 2, the second edge 244 of the conductor 240 (i.e., floating gate) is disposed over a part of the first-type doped well 260, i.e., the floating gate does not extend beyond the first-type doped well 260. Therefore, in the non-volatile memory cell 210, the conductor 240 only covers three corners of isolation structure C1, C2, C3. As illustrated in FIG. 1, the floating gate FG of the conventional non-volatile memory cell 110 covers four corners of isolation structure C', C'', C''', C''''. Accordingly, compared with the prior art, the non-volatile memory cell 210 can relatively lower leakage currents generated at the corners of isolation structure so that the device performance is improved.

Additionally, a length of the transistor portion G1 of the conductor 240 in a direction (i.e., a lengthwise direction of the conductor 210) perpendicular to an lengthwise direction of the isolation structures 270 is L1, another length of the capacitor portion G2 of the conductor 240 in the direction perpendicular to the lengthwise direction of the isolation structures 270 is L2. In an embodiment of the present invention, the length L1 of the transistor portion G1 and the length L2 of the capacitor portion G2 are equal to each other. In another embodiment of the present invention, the length L1 of the transistor portion G1 and the length L2 of the capacitor portion G2 are different from each other.

Moreover, in an embodiment, a width of the first-type doped well 260 in the direction perpendicular to the lengthwise direction of the isolation structures 270 is L3, and the width L3 of the first-type doped well 260 can be for example larger than twice of the length L2 of the capacitor portion G2.

Compared with the conventional cell design (as illustrated in FIG. 2), an edge length of an overlap portion between the capacitor portion G2 of the capacitor 230 and the first-type doped well 260 of the non-volatile memory cell 210 is increased. Therefore, the capacitor 230 can achieve higher coupling efficiency, the operating voltage of the memory device can be lowered and thus the device performance is improved.

Next, a layout structure of non-volatile memory device in accordance with an embodiment of the present invention will be described below in detail with reference to FIG. 3.

Figure 3:
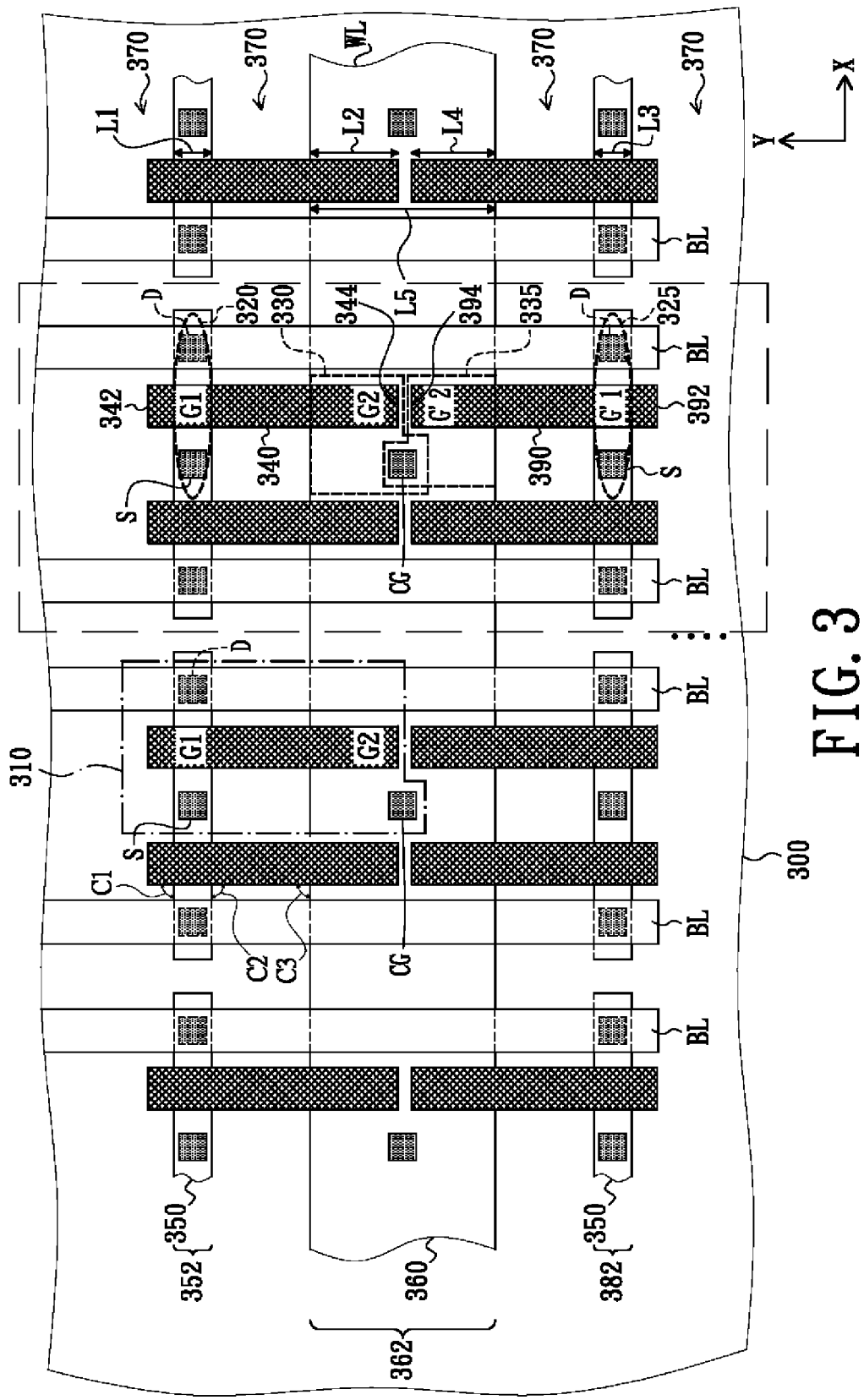
FIG. 3 shows a schematic, partial top view of a layout structure of non-volatile memory device in accordance with an embodiment of the present invention.

FIG. 3 shows a schematical, partial top view of the layout structure of non-volatile memory device.

A semiconductor substrate 300 has a plurality of isolation structures 370 disposed therein and thereby parallel-arranged a plurality of first transistor regions 352, a plurality of capacitor regions 362 and a plurality of second transistor regions 382 are defined in the semiconductor substrate 300. Each of the capacitor regions 362 is arranged between corresponding first transistor region 352 and second transistor region 382. Moreover, each two adjacent capacitor regions 362 have corresponding first transistor region 352 and second transistor region 382 arranged therebetween. That is, the layout structure of non-volatile memory employs transistor region-capacitor region-transistor region as a repeating unit. FIG. 3 only shows one first transistor region 352, one capacitor region 362 and one second transistor region 382 for the purpose of illustration, but not used to limit the present invention.

As illustrated in FIG. 3, in the illustrated embodiment, the semiconductor substrate 300 is for example an non-doped semiconductor substrate, and the first and second transistor regions 352, 382 each have discontinuous second-type doped wells 350 for example P-type doped wells disposed therein. It is understood that, in another embodiment, a second-type doped material can be directly doped in the semiconductor substrate 300 instead, so that the semiconductor substrate 300 becomes a second-type doped semiconductor substrate for example a P-type doped semiconductor substrate.

In another aspect, the capacitor region 362 has a first-type doped well 360 disposed therein.

A plurality of first conductors 340 are arranged in parallel with one another and over the isolation structures 370, the first transistor region 352 and the first-type doped well 360. Each of the first conductors 340 includes a first capacitor portion G2 and a first transistor portion G1, the first capacitor portion G2 is disposed over the corresponding first-type doped well 360, and the first transistor portion G1 is disposed over the corresponding first transistor region 352. Each of the first conductors 340 further includes a first edge 342 and a second edge 344 opposite to each other, the first edge 342 is disposed over the isolation structure 370 at a side of the corresponding first transistor region 352, and the second edge 344 is disposed over the corresponding first-type doped well 360.

A plurality of second conductors 390 are arranged in parallel with one another and over the isolation structures 370, the second transistor region 382 and the first-type doped well 360. Each of the second conductors 390 includes a second capacitor portion G'2 and a second transistor portion G'1, the second capacitor portion G'2 is disposed over the corresponding first-type doped well 360, and the second transistor portion G'1 is disposed over the corresponding second transistor region 382. Each of the second conductors 390 further includes a third edge 392 and a fourth edge 394, the third edge 392 is disposed over the isolation structure 370 at a side of the corresponding second transistor region 382, and the fourth edge 394 is disposed over the corresponding first-type doped well 360 and adjacent with one of the second ends 344.

More specifically, each of the first conductors 340 and second conductors 390 starts from above a corresponding isolation structure 370 and extends over a part of the corresponding first-type doped well 360. The first conductors 340 and the second conductors 390 each are made of a conductive material, for example doped poly-silicon. Moreover, the first conductors 340 and the second conductors 390 act as floating gates of the non-volatile memory.

A plurality of first ion doped regions and a plurality of second ion doped regions of the layout structure of non-volatile memory device associated with the present invention are, for example N-type ion doped regions. The first ion doped regions are disposed in the corresponding first transistor region 352 and at two sides of the respective first transistor portions G1 of the first conductors 340, as well as disposed in the corresponding second transistor region 382 and at two sides of the respective second transistor portions G'1 of the second conductors 390. Each of the first ion doped regions can act as one of source electrodes S and drain electrodes D of components. The first ion doped regions can constitute a plurality of first transistors 320 cooperatively with the respective first transistor portions G1 of the first conductors 340, as well as can constitute a plurality of second transistors 325 cooperatively with the respective second transistor portions G'1 of the second conductors 390.

In addition, each of the second ion doped regions is disposed in the first-type doped well 360 and between two adjacent first conductor 340 and second conductor 390. The second ion doped regions constitute first capacitors 330 cooperatively with the respective first capacitor portions G2 of the first conductors 340, as well as constitute second capacitors 335 cooperatively with the respective second capacitor portions G'2 of the second conductors 390. Each of the second ion doped regions acts as a control gate CG of the non-volatile memory device.

Furthermore, the layout structure of non-volatile memory in accordance with the present invention further includes a plurality of word lines WL (only one word line is shown for the purpose of illustration) and a plurality of bit lines BL (not shown). The word lines WL are arranged in parallel with one another and on the semiconductor substrate 300. The word lines WL are electrically coupled to the respective second ion doped regions (i.e., control gates CG). The bit lines BL are arranged perpendicular to the word lines WL. The bit lines BL are electrically coupled to the respective drain electrodes D of the first and second transistors.

Still referring to FIG. 3, a length L1 of the first transistor portion G1 in a direction (i.e., a lengthwise direction of the first conductor 340) perpendicular to a lengthwise direction (i.e., the X-axis coordinate direction of FIG. 3) of the isolation structures 370 is equal to or different from another length L2 of the first capacitor portion G2 in the same direction. Likewise, a length L3 of the second transistor portion G'1 in the Y-axis coordinate direction is equal to or different from another length L4 of the second capacitor portion G'2. In one embodiment, the length L2 of the first capacitor portion G2 in the Y-axis coordinate direction is equal to the length L4 of the second capacitor portion G'2.

Moreover, a width of the first-type doped well 360 in the direction perpendicular to the lengthwise direction of the isolation structures 370 is L5. When the length L2 of the first capacitor portion G2 and the length L4 of the second capacitor portion G'2 are equal to each other, the width L5 of the first-type doped well 360 is for example larger than twice of the length L2 of the first capacitor portion G2.

Still referring to FIG. 3, one first transistor 320 and one first capacitor 330 can constitute one non-volatile memory cell 310. One second transistor 325 and one second capacitor 335 can constitute another one non-volatile memory cell 310. Therefore, the layout structure of non-volatile memory device in accordance with the present invention includes a plurality of non-volatile memory cells arranged in an array, wherein each pair of two adjacent non-volatile memory cells 310 (the rectangular dashed-line box in FIG. 3 is included two pairs therein) as illustrated in FIG. 3 are arranged in the Y-axis coordinate direction in which only one control gate CG and only one word line WL are shared between the two adjacent non-volatile memory cells 310. Furthermore, in the layout structure of non-volatile memory device in accordance with the present invention, the non-volatile memory cells are mirror-arranged, and therefore much more memory cells can be configured in per unit area so that the device density is increased.

As illustrated in FIG. 3, the layout structure of non-volatile memory device in accordance with the present invention uses transistor region-capacitor region-transistor region as the repeating unit, each two adjacent transistor regions 352, 382 and one capacitor region 362 arranged therebetween have two first conductors 340 and two second conductors 390 disposed thereover, i.e., four non-volatile memory cells are configured. Accordingly, the layout structure of non-volatile memory device in accordance with the present invention can use one word line WL to control four bit lines BL.

The conventional memory cell 110 as illustrated in FIG. 1 employs one word line WL to control two bit lines BL, while the layout structure of non-volatile memory device in accordance with the present invention can use one word line WL to control four bit lines BL. Compared with the conventional device design, the layout structure of non-volatile memory device in accordance with the present invention can increase the programming speed of memory device.

It is indicated that, FIG. 3 only is a partial view of the layout structure of non-volatile memory device in accordance with the present invention for the purpose of illustration. The layout structure of non-volatile memory device in accordance with the present invention can have four or more than four memory cells. For example, some layout structures would include eight, sixteen, thirty-two, sixty-four or even more memory cells. The description associated with the present layout structure does not limit any particular number of memory cells.

In summary, the non-volatile memory cell and the layout structure of non-volatile memory device in accordance with the present invention at least can achieve the advantages (1)~(4) as follows:

(1) Compared with the prior art, the corners of isolation structure in the memory cell is reduced, leakage currents generated at the corners of isolation structure can be lowered and thus the device performance is improved.

(2) Compared with the conventional component design, the capacitor associated with the present invention can achieve higher coupling efficiency, the operating voltage of memory device can be lowered and thus the device performance is improved.

(3) The layout structure of non-volatile memory device in accordance with the present invention can use one word line WL to control four bit lines BL, and thus the program speed of memory device can be increased.

(4) The layout structure of non-volatile memory device in accordance with the present invention can configure much more memory cells in per unit area, compared with the prior art, and thus the device density is increased.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A layout structure of non-volatile memory device, comprising:
   a semiconductor substrate having a plurality of isolation structures disposed therein and thereby a plurality of first transistor regions, a plurality of capacitor regions and a plurality of second transistor regions are defined in the semiconductor substrate, wherein each of the capacitor regions is disposed between corresponding first and second transistor regions in the Y-axis coordinate direction, and each two adjacent capacitor regions have corresponding first and second transistor regions arranged therebetween in the Y-axis coordinate direction;
   a plurality of first-type doped wells disposed in the respective capacitor regions;
   a plurality of first conductors arranged over the isolation structures, the first transistor regions and the first-type doped wells, wherein each of the first conductor comprises a first capacitor portion, a first transistor portion, a first edge and a second edge opposite to the first edge, the first capacitor portion is disposed over a corresponding first-type doped well, the first transistor portion is disposed over a corresponding first transistor region, the first edge is disposed over the isolation structure at a side of the corresponding first transistor region, and the second edge is disposed over the corresponding first-type doped well;
   a plurality of second conductors arranged over the isolation structures, the second transistor regions and the first-type doped wells, wherein each of the second conductor comprises a second capacitor portion, a second transistor portion, a third edge and a fourth edge opposite to the third edge, the second capacitor portion is disposed over a corresponding first-type doped well, the second transistor portion is disposed over a corresponding second transistor region, the third edge is disposed over the isolation structure at a side of the corresponding second transistor region, and the fourth edge is disposed over the corresponding first-type doped well and adjacent to one of the second edges of the first conductors;
   a plurality of first ion doped regions disposed in the respective first transistor regions at two sides of the first conductors, as well as disposed in the respective second transistor regions at two sides of the second conductors; the first ion doped regions constitute a plurality of first transistors cooperatively with the respective first transistor portions of the first conductors, as well as constitute a plurality of second transistors cooperatively with the respective second transistor portions of the second conductors; and
   a plurality of second ion doped regions, wherein each of the second ion doped regions is disposed in the first-type doped well and between adjacent first conductor and second conductor, the second ion doped regions constitute a plurality of capacitors cooperatively with the respective first capacitor portions of the first conductors and second capacitor portions of the second conductors, each of the second ion doped regions acting as a control gate shared by a pair of two adjacent capacitors arranged in the Y-axis coordinate direction;
   a plurality of word lines arranged on the semiconductor substrate, wherein the word lines are electrically coupled to the respective second ion doped regions; and
   a plurality of bit lines arranged perpendicular to the word lines and on the semiconductor substrate, wherein the bit lines are electrically coupled to a part of the first ion doped regions respectively;
   wherein each pair of two adjacent capacitors and corresponding first and second transistors sharing the same first and second conductors with the pair of two adjacent capacitors cooperatively constitute a pair of two adjacent non-volatile memory cells arranged in the Y-axis coordinate direction, and only one control gate and only one word line are shared between the two adjacent non-volatile memory cells arranged in the Y-axis coordinate direction.

2. The layout structure of non-volatile memory device as claimed in claim 1, wherein lengths of the first transistor portion and the first capacitor portion of each of the first conductors in the Y-axis coordinate direction are equal to each other.

3. The layout structure of non-volatile memory device as claimed in claim 1, wherein lengths of the first transistor portion and the first capacitor portion of each of the first conductors in the Y-axis coordinate direction are different from each other.

4. The layout structure of non-volatile memory device as claimed in claim 1, wherein lengths of the second transistor portion and the second capacitor portion of each of the second conductors in the Y-axis coordinate direction are equal to each other.

5. The layout structure of non-volatile memory device as claimed in claim 1, wherein lengths of the second transistor portion and the second capacitor portion of each of the second conductors in the Y-axis coordinate direction are different from each other.

6. The layout structure of non-volatile memory device as claimed in claim 1, wherein the semiconductor substrate is a second-type doped semiconductor substrate.

7. The layout structure of non-volatile memory device as claimed in claim 6, wherein the first-type doped wells are N-type doped wells, the first ion doped regions and the second ion doped regions are N-type ion doped regions, and the semiconductor substrate is a P-type semiconductor substrate.

8. The layout structure of non-volatile memory device as claimed in claim 1, further comprising a plurality of second-type doped wells sequentially arranged and discontinuously disposed in the respective first transistor regions and second transistor regions, and the first ion doped regions being disposed in the respective second-type doped wells.

9. The layout structure of non-volatile memory device as claimed in claim 8, wherein the first-type doped wells are N-type doped wells, the first ion doped regions and the second ion doped regions are N-type ion doped regions, and the second-type doped wells are P-type doped wells.

10. The layout structure of non-volatile memory device as claimed in claim 1, wherein lengths of the first capacitor portions and the second capacitor portions in the Y-axis coordinate direction are equal to each other.

11. The layout structure of non-volatile memory device as claimed in claim 10, wherein a width of each of the first-type doped wells in the Y-axis coordinate direction is larger than twice of the length of each of the first capacitor portions in the Y-axis coordinate direction.

12. A layout structure of non-volatile memory device, comprising:
a semiconductor substrate having a first transistor region, a common capacitor region and a second transistor region arranged in the Y-axis coordinate direction in that order and spaced from one another;
a first-type doped well disposed in the common capacitor region;
a plurality of first conductors arranged over the first transistor region and the first-type doped well, wherein each of the first conductors comprises a first edge and a second edge opposite to the first edge, the first edge is disposed at an outside of the first transistor region away from the first-type doped well, and the second edge is disposed directly above the first-type doped well;
a plurality of second conductors arranged over the second transistor region and the first-type doped well, wherein each of the second conductors comprises a third edge and a fourth edge opposite to the third edge, the third edge is disposed at an outside of the second transistor region away from the first-type doped well, and the fourth edge is disposed directly above the first-type doped well and adjacent to the second edge of one of the first conductors;
a plurality of first ion doped regions disposed in the first transistor region at two sides of the first conductors, as well as disposed in the second transistor region at two sides of the second conductors; the first ion doped regions constitute a plurality of first transistors cooperatively with the respective first conductors, as well as constitute a plurality of second transistors cooperatively with the respective second conductors; and
a second ion doped region, wherein the second ion doped region acts as a control gate shared by two of the first conductors and two of the second conductors, and the two first conductors and two second conductors are arranged surrounding the second ion doped region to thereby form two pairs of two adjacent capacitors arranged in the Y-axis coordinate direction;
a word line arranged on the semiconductor substrate and electrically coupled to the second ion doped region;
wherein each pair of two adjacent capacitors and corresponding first and second transistors sharing the same first and second conductors with the pair of two adjacent capacitors cooperatively constitute a pair of two adjacent non-volatile memory cells arranged in the Y-axis coordinate direction, only one control gate and only one word line are shared between the two adjacent non-volatile memory cells arranged in the Y-axis coordinate direction.

13. The layout structure of non-volatile memory device as claimed in claim 12, further comprising:
a plurality of bit lines arranged substantially perpendicular to the word line and on the semiconductor substrate, wherein the bit lines are electrically coupled to a part of the first ion doped regions respectively.

14. A layout structure of non-volatile memory device, comprising:
a semiconductor substrate;
a plurality of word lines arranged on the semiconductor substrate;
a plurality of ion doped regions disposed in the semiconductor substrate and each acting as a control gate electrically coupled with a corresponding one of the word lines;
a plurality of bit lines arranged substantially perpendicularly crossing over with the word lines on the semiconductor substrate and extending along the Y-axis coordinate direction;
a plurality of pairs of non-volatile memory cells arranged in the semiconductor substrate and electrically coupled to the respective word lines and bit lines,
wherein each pair of non-volatile memory cells comprise two adjacent non-volatile memory cells arranged in the Y-axis coordinate in which only one control gate and only one word line are shared between the two adjacent non-volatile memory cells arranged in the Y-axis coordinate direction.

* * * * *